United States Patent
Yokoi

(10) Patent No.: US 7,332,395 B2
(45) Date of Patent: Feb. 19, 2008

(54) METHOD OF MANUFACTURING A CAPACITOR

(75) Inventor: Naoki Yokoi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 150 days.

(21) Appl. No.: 11/255,972

(22) Filed: Oct. 24, 2005

(65) Prior Publication Data

US 2006/0099768 A1    May 11, 2006

(30) Foreign Application Priority Data

Nov. 9, 2004    (JP)    ............................. 2004-325507

(51) Int. Cl.
*H01L 21/8242*    (2006.01)
(52) U.S. Cl. ................ 438/253; 438/396; 257/E27.088
(58) Field of Classification Search ........ 438/253–256, 438/396–399, 3; 257/E27.088
See application file for complete search history.

(56) References Cited

U.S. PATENT DOCUMENTS

2003/0017669 A1* 1/2003 Kiyotoshi et al. .......... 438/245

2005/0287738 A1* 12/2005 Cho et al. .................. 438/253

FOREIGN PATENT DOCUMENTS

| JP | 6-85171 A | 3/1994 |
|---|---|---|
| JP | 10-335592 A | 12/1998 |
| JP | 2003-297952 A | 10/2003 |

* cited by examiner

Primary Examiner—H. Jey Tsai
(74) Attorney, Agent, or Firm—McDermott Will & Emery LLP

(57) ABSTRACT

A method of manufacturing a stack capacitance type capacitor is provided, which prevents the problem that the capacitor cannot be formed because a lower electrode collapses with the external wall thereof exposed in forming the lower electrode of the capacitor in a deep hole formed in silicon oxide, and removing silicon oxide that is a support base material for the lower electrode using a solution containing hydrogen fluoride to expose the external wall of the lower electrode. According to the invention, the support base material in which a deep hole is formed is formed with an amorphous carbon film, the amorphous carbon film used as the support base material for the lower electrode is removed by dry etching after forming the lower electrode, and it is thereby possible to prevent the lower electrode from collapsing.

13 Claims, 5 Drawing Sheets

(a)

(b)

(c)

(d)

(e)

(f)

(a)

(b)

(c)

(d)

(e)

(f)

METHOD OF MANUFACTURING A CAPACITOR

BACKGROUND OF THE INVENTION

1. Field of the Invention

The present invention relates to a method of manufacturing a capacitor used in DRAM (Dynamic Random Access Memory) suitable for preventing the problem of collapse of a lower electrode of the capacitor with a high aspect ratio.

2. Related Art

In manufacturing of semiconductor devices, various structures are formed on a semiconductor board, and with increases in packing density of the semiconductor device, there has been a tendency that the dimensions of the structure are decreased in the direction parallel with a surface of the board while being increased in the direction perpendicular to the surface. The ratio of the dimensions is called the aspect ratio, and indicates a ratio of the perpendicular dimension to the parallel dimension, i.e. a length-to-width ratio. Generally, as the aspect ratio is higher, the degree of difficulty is remarkably increased in manufacturing the semiconductor device. As a suitable example, there is a capacitor used in DRAM.

Referring to FIG. 1, a method will be described below of manufacturing a cylindrical capacitor lower electrode with a high aspect ratio in conventional techniques.

FIGS. 1(a) to 1(f) are a series of cross-sectional views showing an example of the conventional manufacturing method for forming a lower electrode of a capacitor on a semiconductor board.

FIG. 1(a) shows a cross-sectional view of process before forming deep holes that are regions to form capacitors.

Word lines 3 including gate electrodes are formed on a surface of a semiconductor board 1 on which predetermined device separation regions 2 are formed, via gate insulting films (that are extremely thin and not shown in the figure). Then, insulating films 6 comprised of silicon oxide, silicon nitride and the like are formed to cover the word lines 3. Further, drains 4 and sources 5 are formed in respective predetermined regions on the surface of the semiconductor board 1 to constitute transistors. First plugs 7 comprised of polysilicon are formed to connect to the sources 5 or drains 4. Each bit line 8 comprised of metal such as tungsten is provided on the plug 7 connected to the source 5. Further, a first interlayer insulting film 10 comprised of silicon oxide and the like is formed to cover the bit line 8, and the surface is once flattened. Meanwhile, each second plug 9 is formed in a predetermined region of the first interlayer insulating film 10 to connect to the plug 7 on the drain 4.

Next, a second interlayer insulating film is formed on the first interlayer insulating film 10 at which the surface of the second plug 9 is exposed in the predetermined region. The second interlayer insulating film is comprised of silicon nitride 11a with a thickness of about 50 nm and thick silicon oxide 11b with a thickness of about 2000 nm. A silicon film 12 with a thickness of 500 nm to be a hard mask is formed on the silicon oxide 11b, and a photoresist 13 is further formed thereon.

FIG. 1(b) shows a cross-sectional view of process up to formation of deep holes that are formation regions for capacitors.

A predetermined pattern is formed on the photoresist shown in FIG. 1(a) using a lithography method. Then, the silicon film 12 is dry etched using the patterned photoresist as a mask, and the pattern is transferred to the silicon film 12. Further, the silicon oxide 11b and silicon nitride 11a are dry etched using the patterned silicon film 12 as a mask to form the deep hole 14. The photoresist is also etched and vanishes for a period during which the deep hole is formed in the thick silicon oxide, it is thereby difficult to form a desired deep hole, and therefore, the silicon film is used as a hard mask. Further, the silicon nitride 11a is provided to prevent the first interlayer insulating film 10 from being etched unnecessarily in dry etching to form the deep hole in the silicon oxide. In consideration of the fact that the dimension of a short side of an opening of the deep hole is 200 nm and the thickness of the silicon oxide 11b is 2000 nm, the aspect ratio (length-to-width ratio of the deep hole) is about 10.

FIG. 1(c) shows a cross-sectional view of process up to formation of a silicon film 15 to be lower electrodes of capacitors.

After performing post-processing of dry etching used in formation of the deep holes, pre-cleaning is performed to remove a natural oxide film on the surface of the second plug 9, and then, the silicon film 15 with a thickness of 40 nm is formed. A mixed solution of ammonia and hydrogen peroxide or the like is used in the post-processing of dry etching. A solution containing hydrogen fluoride is used in removing the natural oxide film.

The silicon film 15 is formed using chemical vapor deposition (hereinafter, referred to as CVD) on conditions as described below. Used as a reactant gas is a mixed gas of monosilane ($SiH_4$) and phosphine ($PH_3$). $PH_3$ is used as a source to introduce phosphorus as impurities to the silicon film so as to provide the film with conductivity. The reaction temperature is 530° C., and low pressure of about 100 Pa is used as reaction ambient pressure. The silicon film formed on the temperature condition is amorphous, and to provide the film with conductivity, heat treatment of about 700° C. is performed to activate the impurities after forming the film.

FIG. 1(d) shows a cross-sectional view of process up to formation of silicon oxide 16 on the entire surface including internal portions of the deep holes.

The silicon oxide 16 is formed by plasma CVD using as a reactant gas TEOS (tetraethoxysilane: Si $(OC_2H_5)_4$) generally used as an organic material. It is possible to fill the deep holes by depositing the silicon oxide 16 to a thickness more than half the dimension of the short side of the opening of the deep hole as viewed on a plan view.

FIG. 1(e) shows a cross-sectional view of process up to removal of the silicon film 15 and silicon oxide 16 on the surface of the silicon oxide 11b. The removal is performed using CMP (Chemical Mechanical Polishing) or dry etching.

FIG. 1(f) is a cross-sectional view of process up to removal of the silicon oxide 11b and the silicon oxide 16 filled in the deep holes, and illustrates collapse of the exposed lower electrode.

The removal of the silicon oxide is performed using a solution at least containing hydrogen fluoride (HF). On the outside of each deep hole, since the silicon nitride 11a with high etching resistance exists even when all the silicon oxide 11b is removed, the first interlayer insulating film 10 as a base coating is not etched. However, on the inside of each deep hole, since silicon nitride does not exist at the bottom of the deep hole, when the solution penetrates the silicon film 15 to be an electrode, the first interlayer insulating film 10 situated under the silicon film 15 is etched unnecessarily. As a result, the problem arises that the silicon film 15 to be an electrode looses a base to support the film and collapses. This problem becomes more serious when the thickness of the silicon film to be a lower electrode is further decreased with progress in fine processing in semiconductor device.

JP 2003-297952 discloses a method of increasing the mechanical strength by adding a support structure to the lower electrode for the purpose of preventing the lower electrode from collapsing even when wet etching by solution is used as described above. However, this method requires addition of a plurality of new processes including lithography to complete formation of the entire deep hole because the support structure is provided at some midpoint of the deep hole, thus being significantly complicated.

In order to prevent the problem of collapse of the lower electrode occurring due to removal of silicon oxide using liquid as described above, it is desired to use dry etching that does not cause problems such as penetration of liquid, substituting for wet etching using liquid. However, the contribution of ions with high energy is indispensable in dry etching of silicon oxide, it is difficult to remove thick silicon oxide with the thickness of 2000 nm by dry etching without providing damage to the shape of the lower electrode in such a state that the lower electrode comprised of polysilicon is already formed inside the deep hole, and dry etching is thus not realistic.

JP H06-85171 discloses a method of using an organic substance as a substitute for silicon oxide as a thick support base material in forming the lower electrode. A deep hole is formed in the organic substance in the same way as the conventional method, and after the lower electrode is formed, only the organic substance is removed by dry etching without exerting effects on the other structures including the lower electrode. However, the organic substance used in this well-known example is photoresist or polyimide resin formed by rotation coating, and has a risk of polluting the semiconductor device. Further, the organic substance is extremely low in heat resistance, and has a defect of causing pattern deformation by thermal shrinkage. Accordingly, there is a problem that its application is difficult to manufacturing of products subsequent to current products having fine structures with the smallest processing dimension less than 130 nm.

As described above, the conventional capacitor manufacturing method has the steps of (1) forming a conductor plug surrounded by an insulating film on a semiconductor board, (2) depositing a thick oxide film on the plug and forming a deep hole in a predetermined region of the thick oxide film to expose the surface of the plug, (3) forming a conductor to be a lower electrode of the capacitor along the internal wall of the deep hole, (4) etching and removing the thick oxide film that is a support base material for the conductor using a solution containing hydrogen fluoride and forming the lower electrode with internal and external walls of the conductor exposed, and (5) forming a dielectric on the surface of the lower electrode and further laminating a conductor to be an upper electrode to form a capacitor. However, in the step of etching the thick oxide film using the solution containing hydrogen fluoride, the problem occurs that the insulating film that is a base of the conductor to be a lower electrode is etched unnecessarily and the lower electrode collapses. Therefore, adjacent lower electrodes come into contact with each other, thereby causing a bit failure, and the manufacturing yield is remarkably reduced.

In order to prevent the aforementioned problem, above-mentioned JP 2003-297952 discloses the method of coupling between lower electrodes with an insulating film to enhance the mechanical strength in order for the lower electrodes with the internal and external walls exposed not to collapse even when the thick oxide film is etched and removed using a solution. However, this method requires addition of a plurality of new processes including lithography, and produces side effects that manufacturing processes are made complicated and it becomes difficult to form the lower electrode structure with high precision.

Further, above-mentioned JP H06-85171 discloses the method of using an organic substance such as a photoresist to constitute a support base material as a substitute for the thick oxide film, removing the organic substance by dry etching and thereby preventing damage to the lower electrode. However, the organic substance such as a photoresist formed by rotation coating is low in heat resistance, causes pattern deformation due to ambient heat in forming the lower electrode, and makes it difficult to construct the lower electrode with a desirable shape.

Furthermore, JP H10-335592 discloses a method of using amorphous carbon as a material to embed between conductors for the purpose of forming an inductor excellent in high-frequency characteristics on a semiconductor board. The general outline is comprised of the steps of (1) coating surfaces of the conductor and amorphous carbon on an insulating film with an insulating film with air permeability, (2) providing heat treatment in an atmosphere of oxygen to vaporize the amorphous carbon by oxidation, and (3) removing vaporized amorphous carbon through the insulating film with air permeability. It is described therein that a series of steps enables formation of hollow space surrounded by the conductor and insulating film, less parasitic capacity, and formation of an inductor excellent in high-frequency characteristics.

In the aforementioned method, it is necessary to remove amorphous carbon through the insulating film in terms of the structure as disclosed. Further, for the removal through the insulating film, a process is required to diffuse oxygen or reaction products in the insulating film, and the contribution of thermal energy is indispensable to promote the diffusion. However, since adjacent conductors are comprised of metal poor in heat resistance and oxidation resistance, it is difficult to set high temperatures, and there arise problems of poor removal efficiency and lack of practical utility.

BRIEF SUMMARY OF THE INVENTION

It is an object of the present invention to provide a method of manufacturing a capacitor to prevent a lower electrode from collapsing when a support base material for the electrode is removed to expose internal and external walls of the electrode, without adding a new support structure to between lower electrodes.

A method of manufacturing a capacitor according to a first aspect of the invention is a method of manufacturing a capacitor with a cylindrical lower electrode used in a semiconductor device, and includes the steps of (1) forming a first insulating film on a semiconductor board with word lines and bit lines formed thereon, (2) providing a conductor plug connected to the board with a surface thereof exposed, in a predetermined position in the first insulating film, (3) depositing a support base material in which the capacitor is to be formed, (4) forming a thin film on a surface of the support base material, patterning the thin film, and forming a deep hole in the support base material using the patterned thin film as a mask, (5) performing processing of cleaning the surface of the conductor plug exposed inside the deep hole, and depositing a material for the lower electrode of the capacitor on an entire surface including the inside of the deep hole, (6) removing the material for the lower electrode formed on the surface of the support base material except the inside of the deep hole, and (7) removing the support base material with the surface thereof exposed by dry etching, where the support base material is comprised of an amorphous carbon film formed by CVD.

A method of manufacturing a capacitor according to a second aspect of the invention is a method of manufacturing a capacitor with a cylindrical lower electrode used in a semiconductor device, and includes the steps of (1) forming a first insulating film and a second insulating film laminated on the first insulating film on a semiconductor board with word lines and bit lines formed thereon, (2) providing a conductor plug connected to the board with a surface thereof exposed, in a predetermined position in the first insulating film and the second insulating film, (3) depositing a support base material in which the capacitor is to be formed, (4) forming a thin film on a surface of the support base material, patterning the thin film, and forming a deep hole in the support base material using the patterned thin film as a mask, (5) performing processing of cleaning the surface of the conductor plug exposed inside the deep hole, and depositing a material for the lower electrode of the capacitor on an entire surface including the inside of the deep hole, (6) removing the material for the lower electrode formed on the surface of the support base material except the inside of the deep hole, and (7) removing the support base material with the surface thereof exposed by dry etching, where the support base material is comprised of an amorphous carbon film formed by CVD. Further, the second insulating film laminated on the first insulating is preferably silicon nitride.

A method of manufacturing a capacitor according to a third aspect of the invention is a method of manufacturing a capacitor with a cylindrical lower electrode used in a semiconductor device, and includes the steps of (1) forming a first insulating film and a second insulating film laminated on the first insulating film on a semiconductor board with word lines and bit lines formed thereon, (2) providing a conductor plug connected to the board with a surface thereof exposed, in a predetermined position in the first insulating film and the second insulating film, (3) depositing a first support base material and a second support base material laminated on the first support base material in which the capacitor is to be formed, (4) forming a thin film on a surface of the second support base material, patterning the thin film, and forming a deep hole in the first support base material and the second support base material using the patterned thin film as a mask, (5) performing processing of cleaning the surface of the conductor plug exposed inside the deep hole, and depositing a material for the lower electrode of the capacitor on an entire surface including the inside of the deep hole, (6) removing the material for the lower electrode formed on the surface of the support base material except the inside of the deep hole, and (7) removing the second support base material with the surface thereof exposed by dry etching, where the second support base material is comprised of an amorphous carbon film formed by CVD.

A method of manufacturing a capacitor according to a fourth aspect of the invention is a method of manufacturing a capacitor with a cylindrical lower electrode used in a semiconductor device, and includes the steps of (1) forming a first insulating film on a semiconductor board with word lines and bit lines formed thereon, (2) providing a conductor plug connected to the board with a surface thereof exposed, in a predetermined position in the first insulating film, (3) depositing a support base material in which the capacitor is to be formed, (4) forming a thin film on a surface of the support base material, patterning the thin film, and forming a deep hole in the support base material using the patterned thin film as a mask, (5) performing processing of cleaning the surface of the conductor plug exposed inside the deep hole, and depositing a material for the lower electrode of the capacitor on an entire surface to embed the deep hole, (6) removing the material for the lower electrode formed on the surface of the support base material except the inside of the deep hole, and (7) removing the support base material with the surface thereof exposed by dry etching, where the support base material is comprised of an amorphous carbon film formed by CVD.

In the invention, the support base material in which a lower electrode of a capacitor is to be formed is comprised of a dense amorphous carbon formed by CVD, and it is thereby possible to avoid deformation due to heat when a deep hole is formed and a material for the lower electrode is further formed. Moreover, the support base material can be removed by dry etching using oxygen and the like, and it is thus possible to prevent the problem that the lower electrode collapses due to solution etching. Accordingly, the invention exerts such an advantageous effect of forming a capacitor while preventing a lower electrode from collapsing even in forming the lower electrode in a deep and narrow deep hole with an aspect ratio of 10 or more.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Figure 1:
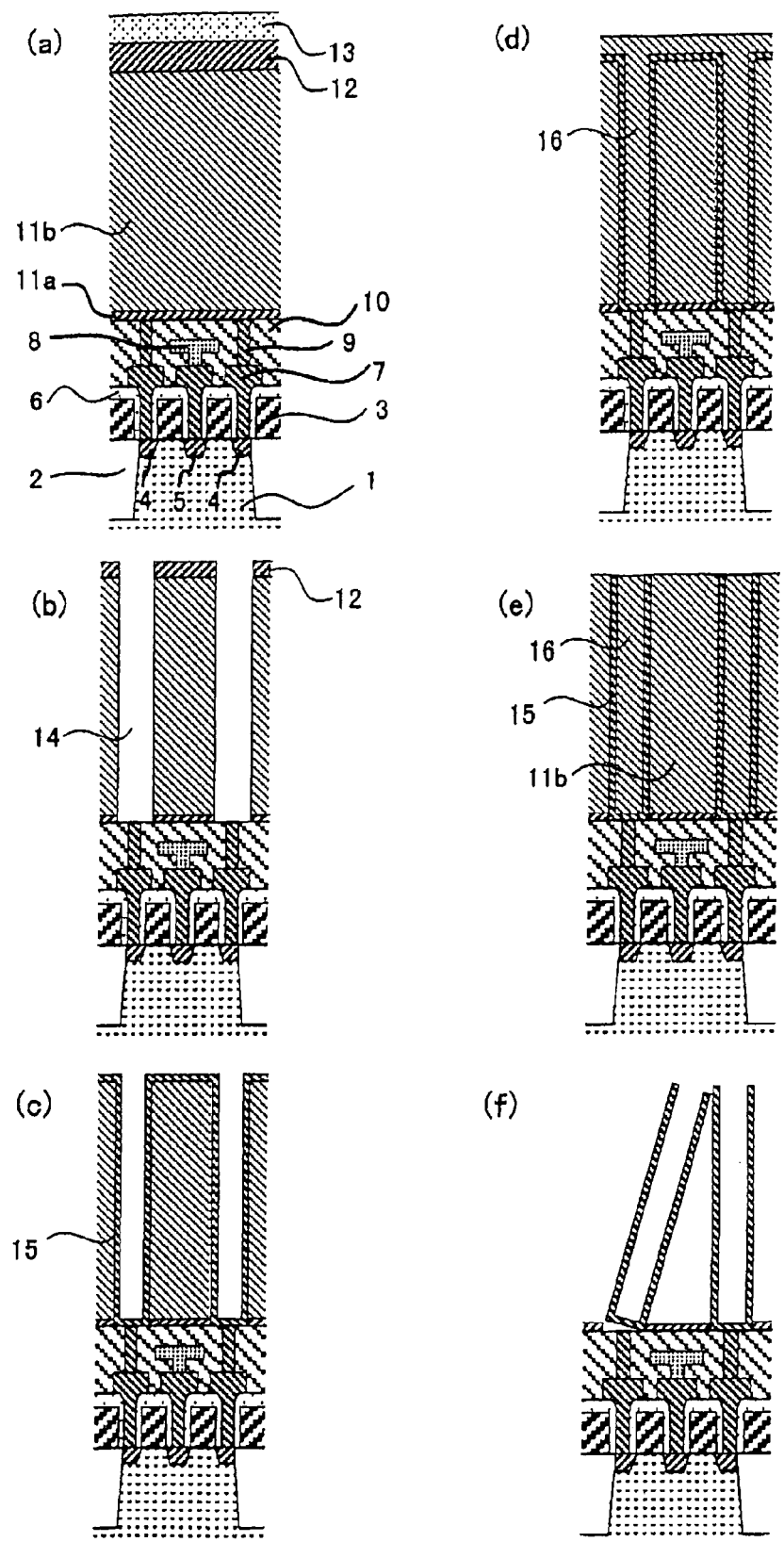
FIGS. 1(a) to 1(f) are a series of process cross-sectional views illustrating a convention method of manufacturing a capacitor.

A method of manufacturing a capacitor according to the invention is comprised of the steps of (1) forming word lines and bit lines in predetermined positions on a semiconductor board, and then, forming a first silicon oxide film to cover the whole including the word lines and bit lines, (2) flattening the surface of the first silicon oxide, and then, providing a plug comprised of silicon connected to the board with the surface thereof exposed, in a predetermined position in the first silicon oxide, (3) depositing a carbon film by CVD as a support base material in which the capacitor is to be formed, (4) forming a thin film on the surface of the carbon film as the support base material, and patterning the thin film by lithography, (5) forming a deep hole in the carbon film by dry etching using the patterned thin film as a mask, (6) performing processing of cleaning the surface of the plug exposed at the bottom of the deep hole, and depositing a silicon film to be a lower electrode of the capacitor on an entire surface including the inside of the deep hole, and (7) removing the silicon film formed on the surface of the carbon film except the inside of the deep hole, and removing the carbon film with the surface thereof exposed by dry etching. By this means, it is possible to prevent the problem of collapse of the lower electrode and to obtain the cylindrical lower electrode with internal and external walls of the lower electrode exposed.

EXAMPLE 1

Example 1 of the invention will be described below based on accompanying drawings, with reference to a series of process cross-sectional views in FIGS. 2(a) to 2(f).

FIG. 2(a) shows a process cross-sectional view of a stage before a capacitor is formed. Device separation regions 202 were formed in predetermined areas of a p-type semiconductor board 201, and then, each gate electrode was formed through a gate insulating film (that is extremely thin and not shown in the figure) on the surface of the silicon board 201. The gate electrode constitutes a word line 203. Each insulating film 206 comprised of silicon oxide and silicon nitride was formed to coat the word line 203. Each source 205 and each drain 204 constituting a transistor were formed on the surface of the silicon board 201. Plugs 207 comprised of polysilicon were formed on the source 205 and drain 204. Further, each bit line 208 comprised of tungsten was formed on the plug 207 connected to the source 205. Then, silicon oxide 209 was formed to cover the plug 207 and bit line 208. Next, the surface of silicon oxide 209 was flattened using CMP (Chemical Mechanical Polishing). Meanwhile, each plug 210 comprised of polysilicon was formed on the plug 207 connected to the drain 204. A lower electrode of a capacitor formed in following descriptions is connected to the semiconductor board 201 via the silicon plugs 207 and 210.

FIG. 2(b) shows a process cross-sectional view of a stage where a carbon film 211, silicon 212 and photoresist 213 were formed on the semiconductor board as shown in FIG. 2(a).

The carbon film 211 was deposited using plasma CVD. The semiconductor board was placed on one electrode in a plasma CVD vessel with parallel plate electrodes. After evacuating the vessel, methane ($CH_4$) was supplied as a material gas, and the pressure inside the vessel was maintained at 600 Pa.

High-frequency power of 1500 w was applied to between the electrodes to generate plasma with the temperature of the semiconductor board heated to 530° C., and the carbon film 211 with a thickness of 2000 nm was deposited on the semiconductor board. Various materials other than methane can be used as a material to form the carbon film. Further, a plurality of materials can be combined to be used. Furthermore, it is possible to select an optimal condition on each of the temperature, pressure and high-frequency power corresponding to the selected material.

Next, the silicon 212 to be used as a hard mask in processing the carbon film 211 was formed by CVD. Using a lower-pressure CVD apparatus and monosilane ($SiH_4$) as a raw material, the silicon 212 was deposited to have a thickness of 100 nm on conditions that the temperature is 530° C. and the pressure is 100 Pa. Further, the photoresist 213 with a thickness of 300 nm was formed on the silicon 212 by well-known rotation coating.

FIG. 2(c) shows a process cross-sectional view of a stage where deep holes 214 were formed in respective predetermined positions in the carbon film 211.

A pattern of openings each with a short side of 200 nm was formed on the photoresist 213 as shown in FIG. 2(b) by well-known lithography using an exposure apparatus with an ArF (argon fluoride) excimer laser as a light source. The silicon 212 was dry etched using the patterned photoresist 213 as a mask, and the pattern was transferred. For dry etching of the silicon 212, for example, plasma etching is used using a gas containing at least chlorine ($Cl_2$). Then, using the patterned photoresist 213 and silicon 212 as a mask, the carbon film 211 was dry etched to form deep holes 214 reaching surfaces of the silicon plugs 210. Ammonia ($NH_3$) can be used as an etching gas in dry etching of the carbon film 211. For example, using a plasma etching apparatus with parallel plate electrodes and ammonia as an etching gas, the carbon film 211 was etched while setting the pressure at a range of 1 to 150 Pa, the ammonia flow rate at a range of 10 to 1000 ml/min, and the high-frequency output at a range of 100 to 3000 W. During the etching, the photoresist 213 vanished, but the silicon 212 remained because silicon is not etched by ammonia. In the stage where the deep holes 214 were formed, the silicon oxide 209 and silicon plug 210 were exposed at the bottom of each of the deep holes 214. It is possible to use oxygen or a mixed gas containing oxygen as a substitute for ammonia.

FIG. 2(d) shows a process cross-sectional view of a stage where a silicon film 215 to be lower electrodes was formed on the entire surface including internal walls of the deep holes 214.

After forming the deep hole 214 as shown in FIG. 2(c), cleaning processing was performed including at least removal of natural oxide film with a thickness of several nanometers existing on the surface of the silicon plug 210. Then, the silicon film 215 to be lower electrodes was deposited on the entire surface including the internal walls of the deep holes 214. Deposition of the silicon film was performed using the low-pressure CVD apparatus as described previously. As a material gas, phosphine ($PH_3$) was supplied concurrently in addition to monosilane, and phosphorus as impurities was contained in the deposited silicon. The concentration of phosphorus in the silicon film was set at a range of $1\sim5\times10^{20}$ atoms/cm$^3$. The silicon film deposited at 530° C. is amorphous and does not exhibit conductivity. Providing the deposited film with heat treatment of about 700° C. causes crystallization and concurrently activates phosphorus, and the silicon film exhibits conductivity. Setting the temperature at 580° C. or more enables deposition in a polycrystalline state, and it is possible to obtain a silicon film with conductivity. However, when a board is inserted into the CVD apparatus and a natural oxide film is formed on a surface of the plug 210 prior to a stage to form the silicon film, it becomes difficult to acquire the continuity. Accordingly, it is preferable to form the silicon film at low temperatures so that the natural oxide film is not formed. The thickness of the silicon film can be about 35 nm.

FIG. 2(e) shows a process cross-sectional view of a stage where the silicon film was removed from the surface of the carbon film 211, and the silicon film 215 was only formed on the internal wall of the deep hole 214.

Removal of the silicon film from the surface of the carbon film 211 was performed using CMP. Further, dry etching can be used other than CMP. In the case of using dry etching, in order to prevent the silicon film inside the deep hole 214 from being etched, it is preferable to fill the inside of the deep hole with a photoresist, for example.

Figure 2:
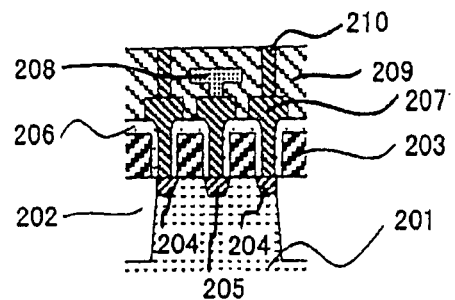
FIGS. 2(a) to 2(f) are a series of process cross-sectional views illustrating Example 1 of the invention.
Figure 2:
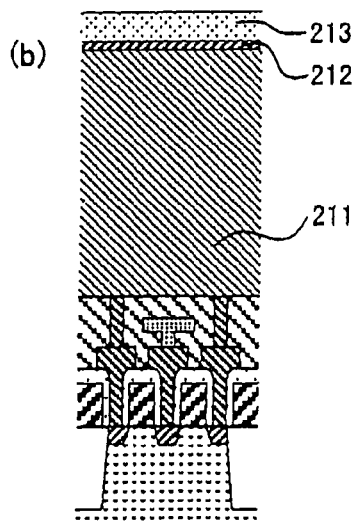
Figure 2:
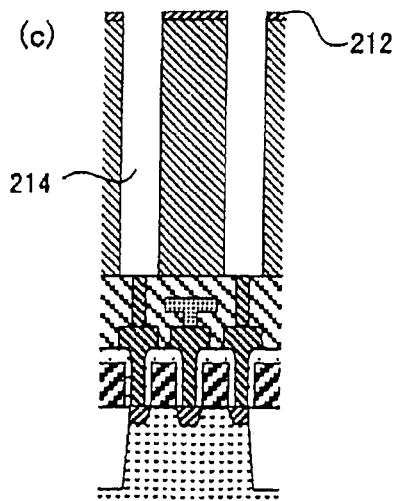
Figure 2:
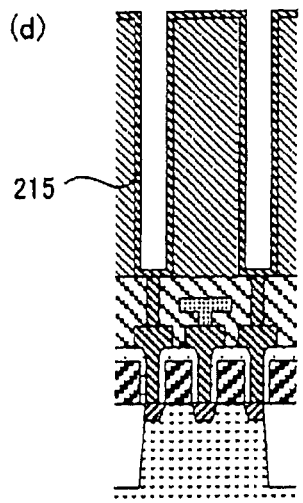
Figure 2:
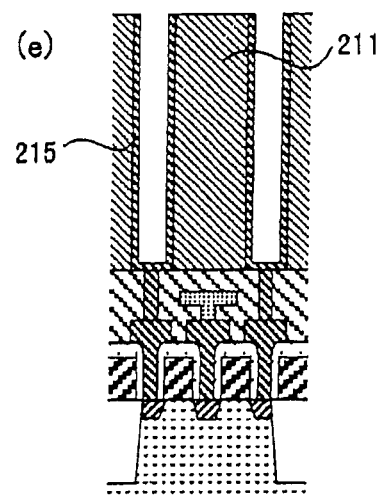
Figure 2:
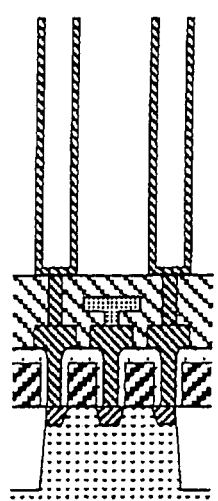

FIG. 2 (f) shows a process cross-sectional view of a stage where the carbon film 211 that was a support base material for the silicon film 215 was removed, and cylindrical lower electrodes were formed with the internal and external walls exposed.

A cylindrical plasma etching apparatus enabling isotropic etching was used for removal of the carbon film 211, and it is possible to use oxygen or a gas containing oxygen other than ammonia as an etching gas. It is possible to select a gas that reacts with the carbon film to form volatile carbon oxide, carbon nitride and/or carbon hydride. It is preferable to set the temperature of the board at about 200° C. in etching. Ammonia and oxygen plasma does not etch the silicon film and silicon oxide film. Accordingly, the shape of the lower electrode does not sustain damage, and since etching by solution such as hydrogen fluoride is not used, it is possible to avoid the problem that the silicon oxide 209 as a base coating is etched unnecessarily and the electrode collapses.

Subsequently, processing was performed of removing the natural oxide film on the surface of the electrode, and the capacitor was constructed through processes of formation of dielectric and formation of an upper electrode. Tantalum pentoxide, aluminum oxide or the like can be used as the dielectric, and titanium nitride, tungsten or the like can be used as the upper electrode.

As described above, according to this Example, the carbon film deposited at temperatures of about 500° C. by CVD is used as a support base material for the lower electrode, and it is thereby possible to form a dense support base material excellent in heat resistance. The advantageous effect is thus provided of preventing an occurrence of pattern deformation which is caused by the photoresist formed by rotation coating containing a large amount of water and thereby being low in heat resistance.

Further, it is possible to remove the carbon film by dry etching using ammonia and oxygen gas that does not etch the silicon film and silicon oxide film. Accordingly, the advantageous effect is produced of preventing the problem that the lower electrode collapses in etching a support base material comprised of silicon oxide using a solution of hydrogen fluoride and the like.

In this Example, it is possible to remove the carbon film by etching in such a state that the surface of the carbon film is exposed due to the constitution applied to the method of manufacturing a capacitor. Such an advantageous effect is thereby provided that the carbon film can be etched with extremely high efficiency, as compared with the case described in JP H10-335592 as described previously where the carbon film is removed with the surface of the carbon film covered with silicon oxide.

EXAMPLE 2

Example 2 of the invention will be described below with reference to a series of process cross-sectional views in FIGS. 3(a) to 3(f). In addition, the basic process in this Example is the same as that in Example 1 described above, and redundant descriptions are omitted.

Figure 3:
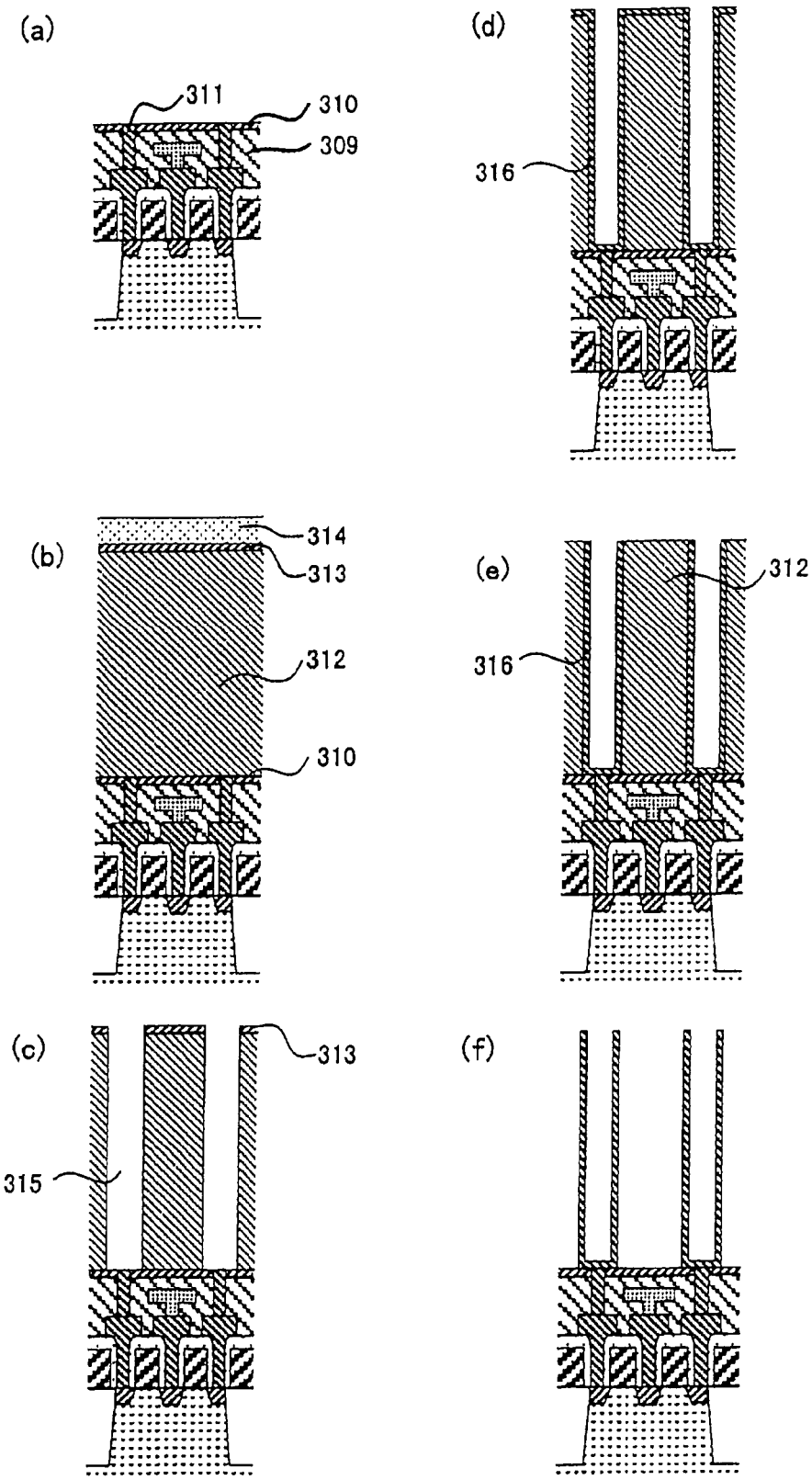
FIGS. 3(a) to 3(f) are a series of process cross-sectional views illustrating Example 2 of the invention.

FIG. 3(a) shows a process cross-sectional view of a stage before a carbon film that is a support base material for a lower electrode is deposited.

After forming silicon oxide 309 to cover bit lines, the surface was flattened. Then, silicon nitride 310 with a thickness of 50 nm was deposited. Contact holes were formed in respective predetermined positions of the laminated film of the silicon oxide 309 and silicon nitride 310. Silicon was embedded in the contact holes to form silicon plugs 311. The silicon nitride 310 was deposited using general low-pressure CVD. Such conditions may be applied that dichlorosilane ($SiH_2Cl_2$) and ammonia is used as a material gas, the temperature is 630° C., and the pressure is 50 Pa. In Example 1, the silicon nitride 310 was not present, and silicon oxide was exposed at the surface. In contrast thereto, in this Example, the silicon nitride 310 and surfaces of the silicon plugs 311 were exposed at the surface.

FIG. 3(b) shows a process cross-sectional view of a stage where a carbon film 312 with a thickness of 2000 nm, and silicon oxide 313 with a thickness of 30 nm and photoresist 314 both laminated on the carbon film 312 were formed.

The silicon film was used as a hard mask in Example 1, and substituting for the silicon film, silicon oxide was used in this Example. The silicon oxide 313 was deposited using plasma CVD, but may be deposited using thermal CVD. In either case, deposition can be obtained at temperatures between 350° C. and 450° C.

FIG. 3(c) shows a process cross-sectional view of a stage where deep holes 315 reaching the surfaces of the silicon plugs 311 were formed in the carbon film 312.

As in Example 1, a pattern formed in the photoresist 314 was transferred to the silicon oxide 313, and then, using the patterned silicon oxide 313 as a hard mask, the deep holes 315 were formed in the carbon film 312. The patterning of the silicon oxide 313 was performed by anisotropic dry etching using a gas containing fluorine (F).

FIG. 3(d) shows a process cross-sectional view of a stage where a silicon film 316 with a thickness of 35 nm to be lower electrodes of capacitors was formed on the entire surface including internal walls of the deep holes.

Before depositing the silicon film 316, the silicon oxide 313 used as a hard mask was removed. Removal of the silicon oxide 313 was performed using etching by solution containing hydrogen fluoride. At this point, when silicon oxide is exposed at the bottom of the deep hole 315, silicon oxide is also etched at the same time. For the purpose of avoiding such etching, the silicon nitride 310 was beforehand formed. An etching rate by hydrogen fluoride on silicon nitride is about one-tenth that on silicon oxide, and thus is slow. Accordingly, the thickness of the silicon nitride 310 is limited to about 3 nm that is etched for a period during which the silicon oxide 313 with the thickness of 30 nm used as a hard mask is etched. It is thereby possible to prevent the silicon oxide 309 to be a base coating from being etched unnecessarily.

FIG. 3(e) shows a process cross-sectional view of a stage where the silicon film was removed from the surface of the carbon film 312, and the silicon film 316 was only formed on internal walls of the deep holes 315, as in Example 1.

FIG. 3(f) shows a process cross-sectional view of a stage where the carbon film 312 used as the support base material was removed, and cylindrical lower electrodes were formed with the internal and external walls exposed.

According to this Example, silicon oxide is used as a hard mask in forming the deep holes in the carbon film and can be made thinner than the silicon film, whereby it is possible to process the deep holes with higher precision. Further, since silicon nitride is formed beforehand under the carbon film, even when silicon oxide used as a hard mask is etched using a solution, it is possible to prevent an unnecessary region from being etched. Furthermore, since the carbon film as a support base material can be removed by dry etching, the effect of preventing etching in the unnecessary region is further improved as compared with Example 1.

EXAMPLE 3

Example 3 of the invention will be described below with reference to a series of process cross-sectional views in FIGS. 4(a) to 4(f). In addition, the basic process in this Example is the same as that in Example 1 or Example 2 described above, and redundant descriptions are omitted.

Figure 4:
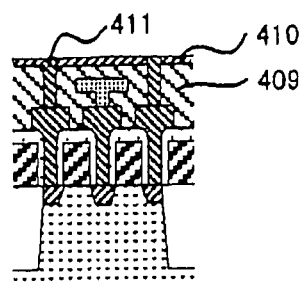
FIGS. 4(a) to 4(f) are a series of process cross-sectional views illustrating Example 3 of the invention.
Figure 4:
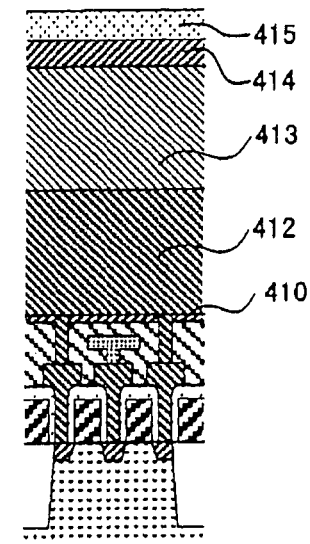
Figure 4:
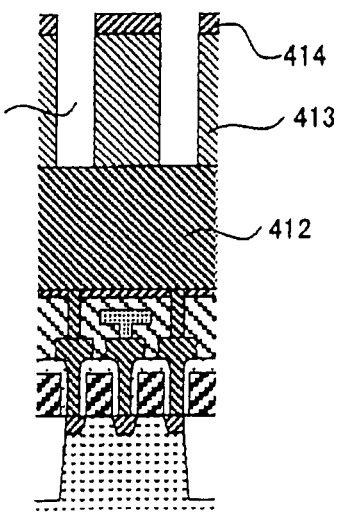
Figure 4:
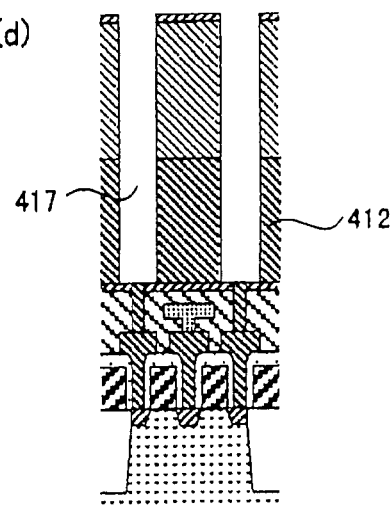
Figure 4:
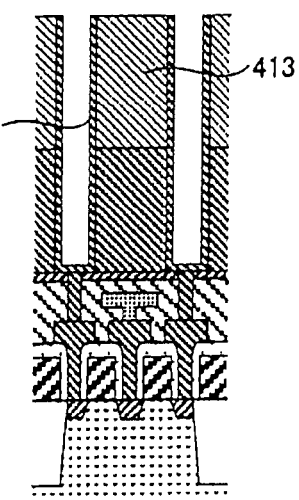
Figure 4:
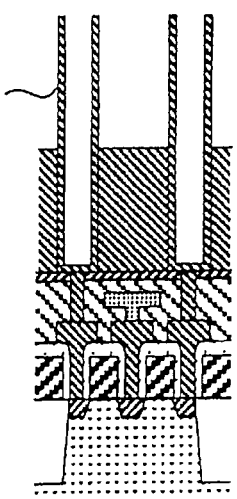

FIG. 4(a) shows a process cross-sectional view of a stage where each silicon plug 411 was formed in a predetermined region in silicon nitride 410 laminated on silicon oxide 409 as in Example 2.

FIG. 4(b) shows a process cross-sectional view of a stage where silicon oxide 412 with a thickness of 1000 nm was deposited subsequent to the stage in FIG. 4(a), and a carbon film 413 with a thickness of 1000 nm, silicon film 414 with a thickness of 300 nm and photoresist 415 were successively laminated and formed on the silicon oxide 412.

FIG. 4(c) shows a process cross-sectional view of a stage where each deep hole was formed in the silicon film 414 and carbon film 413.

In the same method as that in Example 1, a predetermined pattern was formed in the photoresist 415, and the pattern was transferred to the silicon film 414 using the patterned photoresist as a hard mask. Further, using the patterned silicon film 414 as a mask, the deep hole 416 was formed in the carbon film 413. As in Example 1, the carbon film 413 can be etched by ammonia or oxygen, and at this point, silicon oxide is not etched. Therefore, at the stage where the silicon oxide 412 situated under the carbon film 413 was exposed, etching was halted in a self-align manner.

FIG. 4(d) shows a process cross-sectional view of a stage where the silicon oxide 412 was etched, and each deep hole 417 reaching the surface of the silicon plug 411 was formed. The silicon film 414 was used as a hard mask in etching the silicon oxide 412.

FIG. 4(e) shows a process cross-sectional view of a stage where the silicon film 418 was formed inside the deep hole 417.

As in Example 1, the surface of the silicon plug 411 exposed in the stage of FIG. 4(d) was cleaned, the silicon film was then deposited by CMP, and the silicon film was removed from the surface of the carbon film 413.

FIG. 4(f) shows a process cross-sectional view of a stage where the carbon film used as part of the support base material was removed, and each cylindrical lower electrode 419 was formed with part of the external wall exposed.

According to this Example, since silicon oxide with the thickness about half that of the support base material is left, it is possible to more firmly prevent collapse of the lower electrode. When the entire support base material is comprised of silicon oxide and a lower half thereof is left, it is required to halt removal of silicon oxide at some midpoint of the removal. In this case, the capacitor area fluctuates due to unevenness of etching, and as a result, fluctuations in capacitance occur inside the board face. In this Example, since only the carbon film can be removed without etching silicon oxide at all, an advantageous effect is produced of suppressing an occurrence of the fluctuations.

EXAMPLE 4

Example 4 of the invention will be described below with reference to a series of process cross-sectional views in FIGS. 5(a) to 5(e). In addition, the basic process in this Example is the same as that in Example 1 described previously, and redundant descriptions are omitted.

Figure 5:
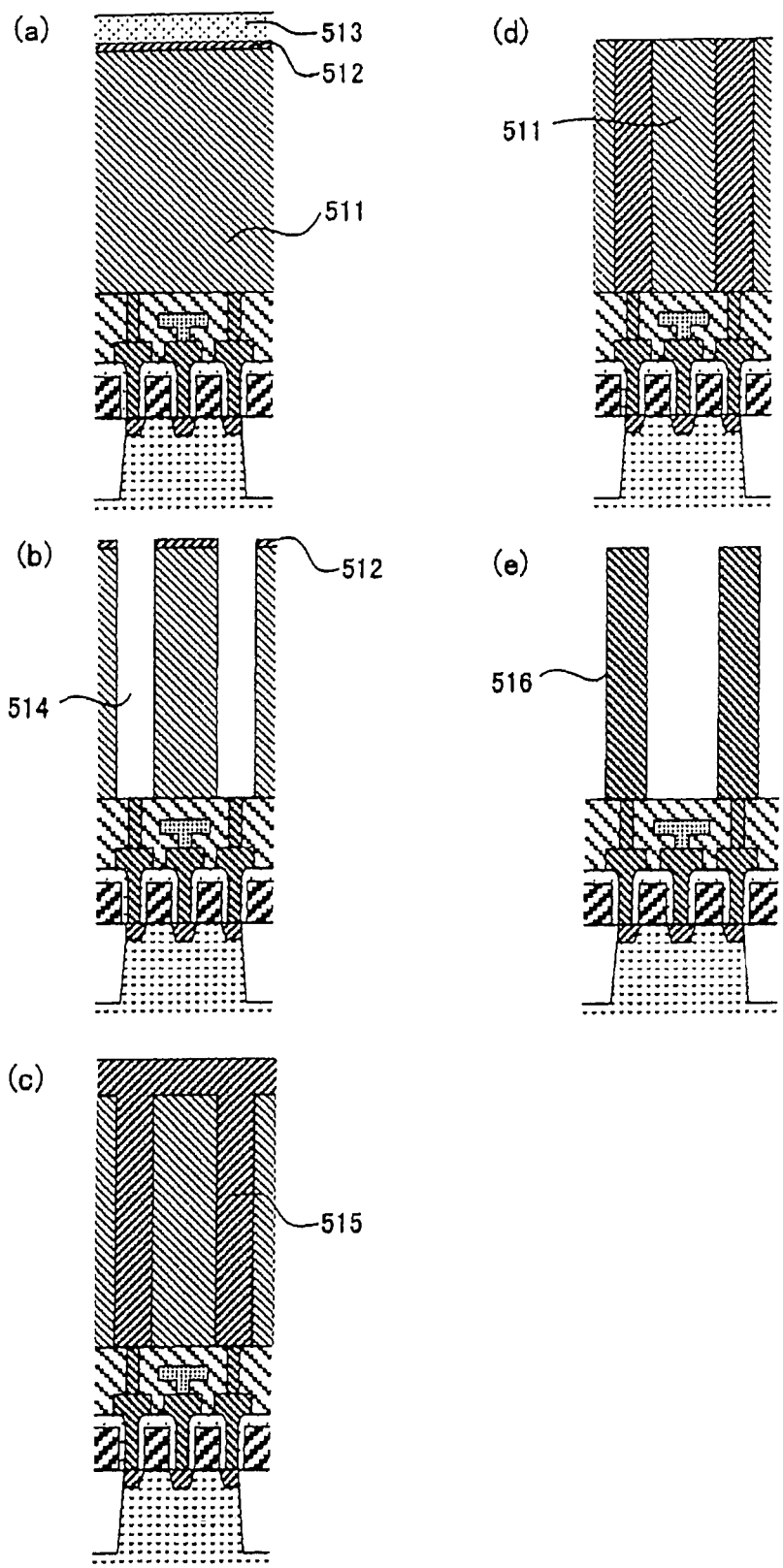
FIGS. 5(a) to 5(e) are a series of process cross-sectional views illustrating Example 4 of the invention.

FIG. 5(a) shows a process cross-sectional view of a stage where a silicon film 512 and photoresist 513 were formed on a carbon film 511 with a thickness of 2000 nm as in Example 1.

The silicon film 512 was herein used as a hard mask and silicon oxide may be used as in Example 2.

FIG. 5(b) shows a process cross-sectional view of a stage where each deep hole 514 reaching the surface of the silicon plug was formed in the carbon film 511 using the silicon film 512 as a mask as in Example 1.

FIG. 5(c) shows a process cross-sectional view of a stage where a silicon film 515 with a thickness of 300 nm was formed to be embedded in each deep hole 514. It is possible to use the same conditions as in Example 1 to deposit the silicon film.

FIG. 5(d) shows a process cross-sectional view of a stage where the silicon film 515 was removed from the surface of the carbon film 511.

To remove the silicon film, CMP can be used as in Example 1, or dry etching may be used.

FIG. 5(e) shows a process cross-sectional view of a stage where the carbon film 511 was removed as in Example 1.

According to this Example, it is possible to use a carbon film as a support base material and form a cylindrical lower electrode. Further, by removing the carbon film by dry etching, the effect is produced of preventing collapse of the cylindrical lower electrode.

The present invention is not limited to the above described embodiments, and various variations and modifications may be possible without departing from the scope of the present invention.

This application is based on the Japanese Patent application No. 2004-325507 filed on Nov. 9, 2004, entire content of which is expressly incorporated by reference herein.

What is claimed is:

1. A method of manufacturing a capacitor with a cylindrical lower electrode used in a semiconductor device, comprising the steps of:
   (1) forming a first insulating film on a semiconductor board with word lines and bit lines formed thereon;
   (2) providing a conductor plug connected to the board with a surface thereof exposed, in a predetermined position in the first insulating film;
   (3) depositing a support base material in which the capacitor is to be formed;
   (4) forming a thin film on a surface of the support base material, patterning the thin film, and forming a deep hole in the support base material using the patterned thin film as a mask;
   (5) performing processing of cleaning the surface of the conductor plug exposed inside the deep hole, and depositing a material for the lower electrode of the capacitor on an entire surface including the inside of the deep hole;
   (6) removing the material for the lower electrode formed on the surface of the support base material except the inside of the deep hole; and
   (7) removing the support base material with the surface thereof exposed by dry etching, wherein the support base material is comprised of an amorphous carbon film formed by CVD.

2. A method of manufacturing a capacitor with a cylindrical lower electrode used in a semiconductor device, comprising the steps of:
   (1) forming a first insulating film and a second insulating film laminated on the first insulating film on a semiconductor board with word lines and bit lines formed thereon;
   (2) providing a conductor plug connected to the board with a surface thereof exposed, in a predetermined position in the first insulating film and the second insulating film;
   (3) depositing a support base material in which the capacitor is to be formed;

(4) forming a thin film on a surface of the support base material, patterning the thin film, and forming a deep hole in the support base material using the patterned thin film as a mask;

(5) performing processing of cleaning the surface of the conductor plug exposed inside the deep hole, and depositing a material for the lower electrode of the capacitor on an entire surface including the inside of the deep hole;

(6) removing the material for the lower electrode formed on the surface of the support base material except the inside of the deep hole; and (7) removing the support base material with the surface thereof exposed by dry etching, wherein the support base material is comprised of an amorphous carbon film formed by CVD.

3. A method of manufacturing a capacitor with a cylindrical lower electrode used in a semiconductor device, comprising:

(1) forming a first insulating film and a second insulating film laminated on the first insulating film on a semiconductor board with word lines and bit lines formed thereon;

(2) providing a conductor plug connected to the board with a surface thereof exposed, in a predetermined position in the first insulating film and the second insulating film;

(3) depositing a first support base material and a second support base material laminated on the first support base material in which the capacitor is to be formed;

(4) forming a thin film on a surface of the second support base material, patterning the thin film, and forming a deep hole in the first support base material and the second support base material using the patterned thin film as a mask;

(5) performing processing of cleaning the surface of the conductor plug exposed inside the deep hole, and depositing a material for the lower electrode of the capacitor on an entire surface including the inside of the deep hole;

(6) removing the material for the lower electrode formed on the surface of the support base material except the inside of the deep hole; and (7) removing the second support base material with the surface thereof exposed by dry etching, wherein the second support base material is comprised of an amorphous carbon film formed by CVD.

4. A method of manufacturing a capacitor with a cylindrical lower electrode used in a semiconductor device, comprising the steps of:

(1) forming a first insulating film on a semiconductor board with word lines and bit lines formed thereon;

(2) providing a conductor plug connected to the board with a surface thereof exposed, in a predetermined position in the first insulating film;

(3) depositing a support base material in which the capacitor is to be formed;

(4) forming a thin film on a surface of the support base material, patterning the thin film, and forming a deep hole in the support base material using the patterned thin film as a mask;

(5) performing processing of cleaning the surface of the conductor plug exposed inside the deep hole, and depositing a material for the lower electrode of the capacitor in the deep hole;

(6) removing the material for the lower electrode formed on the surface of the support base material except the inside of the deep hole; and (7) removing the support base material with the surface thereof exposed by dry etching, wherein the support base material is comprised of an amorphous carbon film formed by CVD.

5. The method of manufacturing a capacitor according to claim 2, wherein the second insulating film laminated on the first insulating film is silicon nitride.

6. The method of manufacturing a capacitor according to claim 3, wherein the second insulating film laminated on the first insulating film is silicon nitride.

7. The method of manufacturing a capacitor according to claim 1, wherein the thin film formed on the surface of the support base material is silicon oxide.

8. The method of manufacturing a capacitor according to claim 2, wherein the thin film formed on the surface of the support base material is silicon oxide.

9. The method of manufacturing a capacitor according to claim 4, wherein the thin film formed on the surface of the support base material is silicon oxide.

10. The method of manufacturing a capacitor according to claim 1, wherein the deep hole formed in the support base material is formed by dry etching using ammonia ($NH_3$) as an etching gas.

11. The method of manufacturing a capacitor according to claim 2, wherein the deep hole formed in the support base material is formed by dry etching using ammonia ($NH_3$) as an etching gas.

12. The method of manufacturing a capacitor according to claim 4, wherein the deep hole formed in the support base material is formed by dry etching using ammonia ($NH_3$) as an etching gas.

13. The method of manufacturing a capacitor according to claim 3, wherein the deep hole formed in the second support base material is formed by dry etching using ammonia ($NH_3$) as an etching gas.

* * * * *